United States Patent
Ma (10) Patent No.: US 10,312,894 B2
(45) Date of Patent: Jun. 4, 2019

(54) APPARATUSES AND METHODS FOR PROVIDING A SIGNAL WITH A DIFFERENTIAL PHASE MIXER

(71) Applicant: MICRON TECHNOLOGY, INC., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/144,772

(22) Filed: Sep. 27, 2018

(65) Prior Publication Data

US 2019/0036517 A1    Jan. 31, 2019

Related U.S. Application Data (63) Continuation of application No. 14/952,382, filed on Nov. 25, 2015, now Pat. No. 10,110,208.

(51) Int. Cl.
  *H03K 5/13* (2014.01)
  *H03K 5/135* (2006.01)
  *H03K 5/00* (2006.01)

(52) U.S. Cl.
  CPC ... *H03K 5/135* (2013.01); *H03K 2005/00052* (2013.01)

(58) Field of Classification Search
  CPC .............. H03K 2005/00052; H03K 5/135
  USPC ........................................... 327/237
  See application file for complete search history.

(56) References Cited

U.S. PATENT DOCUMENTS

| 6,438,051 B1 * | 8/2002 | Fifield .................. G11C 7/04 327/51 |
|---|---|---|
| 7,202,721 B2 | 4/2007 | Jeon |
| 7,404,018 B2 * | 7/2008 | Dietrich ............. G11C 7/1066 710/52 |
| 7,593,496 B2 | 9/2009 | Fan et al. |
| 7,778,095 B2 | 8/2010 | Na |
| 8,878,586 B2 | 11/2014 | Kwak et al. |
| 8,901,981 B2 | 12/2014 | Park et al. |
| 9,197,202 B2 * | 11/2015 | Jang .................. H03K 5/131 |
| 9,484,900 B2 | 11/2016 | Cohen |
| 9,531,364 B2 | 12/2016 | Ma et al. |
| 10,110,208 B2 | 10/2018 | Ma |
| 2006/0001463 A1 | 1/2006 | Lee et al. |
| 2007/0030753 A1 | 2/2007 | Kwak |

(Continued)

OTHER PUBLICATIONS

International Search Report and Written Opinion for Application No. PCT/US2016/060640 dated Feb. 28, 2017.

*Primary Examiner* — Ryan Jager
(74) *Attorney, Agent, or Firm* — Dorsey & Whitney LLP (57) ABSTRACT

According to one embodiment, an apparatus is described. The apparatus comprises a first phase mixer circuit configured to receive a first signal and a second signal and provide a first intermediate signal having a phase between a phase of the first signal and a phase of the clock signal. The apparatus further comprises a second phase mixer circuit configured to receive a complement of the first signal and a complement of the second signal and provide a second intermediate signal having a phase between a phase of the complement of the first signal and a phase of the complement of the second signal, wherein the second intermediate signal is combined with the first intermediate signal at a node to provide an output signal.

20 Claims, 6 Drawing Sheets

(56) References Cited

U.S. PATENT DOCUMENTS

| | | | |
|---|---|---|---|
| 2007/0069786 A1* | 3/2007 | Chung | H03K 3/0375 327/198 |
| 2009/0222713 A1* | 9/2009 | Shin | G06F 11/1004 714/807 |
| 2014/0002173 A1 | 1/2014 | Park et al. | |
| 2014/0211898 A1* | 7/2014 | Katoh | H03H 11/20 375/371 |
| 2014/0368244 A1 | 12/2014 | Ma | |
| 2015/0054558 A1* | 2/2015 | Jang | H03K 5/131 327/250 |
| 2016/0134266 A1* | 5/2016 | Cohen | H03K 5/135 327/158 |
| 2016/0277015 A1 | 9/2016 | Ma et al. | |

* cited by examiner

APPARATUSES AND METHODS FOR PROVIDING A SIGNAL WITH A DIFFERENTIAL PHASE MIXER

CROSS-REFERENCE TO RELATED APPLICATION(S)

This application is a continuation of U.S. patent application Ser. No. 14/952,382, filed Nov. 25, 2015 and issued as U.S. Pat. No. 10,110,208 on Oct. 23, 2018. The aforementioned application, and issued patent, is incorporated by reference herein, in its entirety, and for any purposes.

BACKGROUND

Typical phase mixer circuits receive two periodic signals having different phases and produce an output periodic signal with a phase between the phases of the two input signals. Phase mixer circuits are common in many memory devices, such as Dynamic Random Access Memory (DRAM), Static Random Access Memory (SRAM), etc. Such devices usually include a single phase mixer circuit. Many traditional phase mixer circuits include a single stage with multiple parallel inverting logic gates ("inverters"). The phase mixer circuit routes each of the periodic signals to a number of parallel inverters. The parallel inverters may be selectively activated or deactivated based on a control signal. By selectively activating some of the parallel inverters, the periodic signals may be weighted relative to one another. After weighting the periodic signals, they may be interpolated (e.g., combined) to produce an output signal with a phase between the phases of the periodic signals.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Many traditional single stage phase mixers suffer from a number of drawbacks. First, they are subject to duty cycle variation. For example, in traditional single stage phase mixers, the phase mixer circuit affects rising edges and falling edges of the periodic signals differently. This may result in significant duty cycle variation between the input signals and the output signal. Duty cycle variation may negatively affect performance of a memory device. For example, in double data rate memory devices, substantial deviation from a 50% duty cycle may reduce the available data eye for performing memory operations. Some traditional phase mixer circuits may experience duty cycle variation by as much as 10-20 ps for a clock cycle of 3 ns. Additionally, traditional single stage phase mixers may experience non-linearity of step size. That is, the amount of delay applied by each step in a delay circuit using a traditional single stage phase mixer is non-uniform, resulting in different amounts of delay from step to step. Non-linearity of step size may, for example, negatively affect the operation of a memory device. Disclosed herein are various embodiments of circuits including differential phase mixer circuits that enable input signal phase mixing with reduced duty cycle variation and increased step size linearity without substantially increasing power consumption or input/output delay time.

Figure 1A:
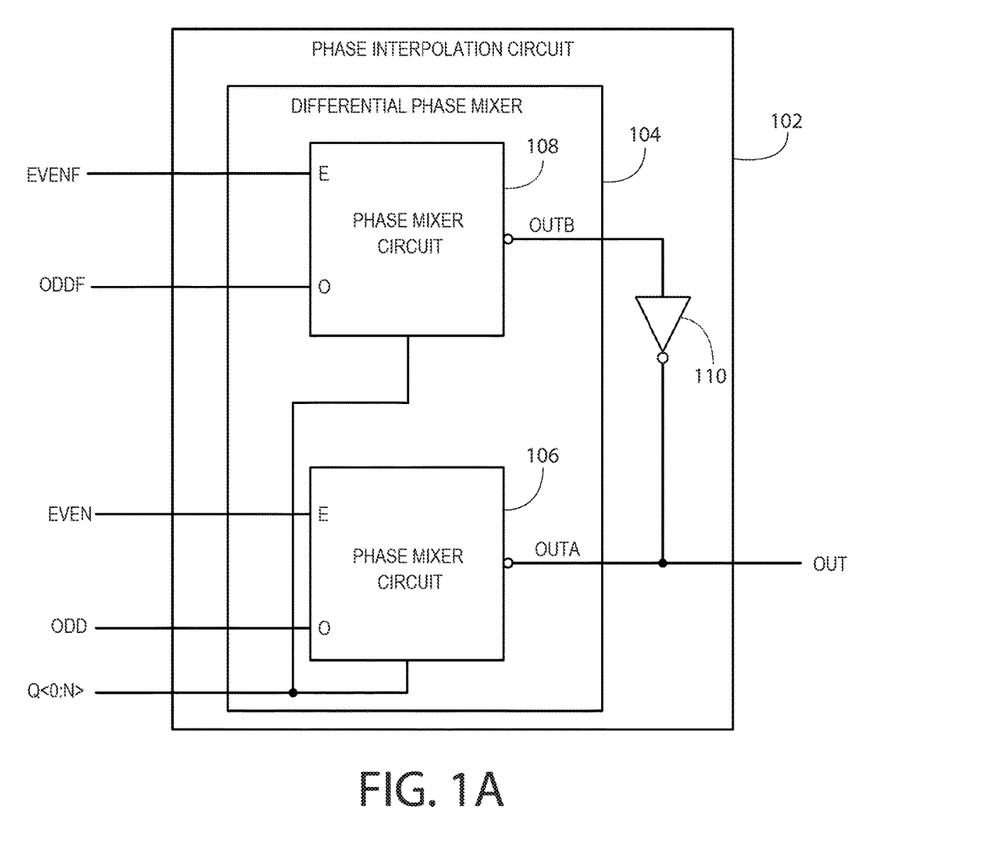
FIG. 1A is a functional block diagram of a phase interpolation circuit, in accordance with an embodiment of the present invention.

FIG. 1A is a functional block diagram of a phase interpolation circuit 102, in accordance with an embodiment of the present invention. The phase interpolation circuit 102 includes a differential phase mixer 104 and an output inverter 110. The differential phase mixer 104 includes phase mixer circuits 106 and 108. The phase interpolation circuit 102 may be configured to receive input signals EVEN, ODD, EVENF, and ODDF and provide an output signal OUT. The input signals EVEN, ODD, EVENF, and ODDF and the output signal OUT may all be periodic signals (e.g., clock signals). The input signal ODD may be received from a delay line circuit, such as a delay locked loop circuit. The input signals EVEN and ODD may have a phase timing difference between them. That is, one of the input signals EVEN, ODD may be leading or lagging behind the other. In general, the input signals EVEN and ODD represent two independent signals having some phase difference between them. In some embodiments, the input signal ODD may be complementary to the input signal EVEN. Similarly, the input signal ODDF may be complementary to the input signal EVENF. The input signals EVENF and ODDF may be complementary to the input signals EVEN and ODD, respectively. In other embodiments, the input signals EVEN and ODD and EVENF and ODDF may have other phase differences. It will be appreciated that the description of "complementary" is intended to be broad, and include, for example, signals that are inverted as well as signals that are 180 degrees out of phase.

As described in further detail below, the phase mixer circuits 106 and 108 may interpolate (e.g., combine) the input signal EVEN and ODD and the input signals EVENF and ODDF, respectively, to provide (e.g., generate) intermediate signals OUTA and OUTB. As will be described in more detail below, the intermediate signal OUTA may have a phase that is based on the phases of the input signals EVENF and ODDF signals and the intermediate signal OUTB may have a phase that is based on the phases of the input signals EVEN and ODD signals. The intermediate signals OUTA and OUTB may be coupled together to provide the output signal OUT. The phase interpolation circuit 102 may be further configured to receive a control signal Q<0:N>. The control signal Q<0:N> may provide control information to the phase mixer circuits 106 and 108 that controls each of the phase mixer circuits 106 and 108 to weight a received input signal (e.g., EVEN, EVENF) relative to the other received input signal (e.g., ODD, ODDF). Accordingly, the phases of the intermediate signals OUTA and OUTB may be configurable based on the control information provided by the control signal Q<0:N>. In various embodiments, the output signal OUT may demonstrate reduced duty cycle variation and increased linearity of step size over many traditional single stage phase mixers. Some embodiments of the present invention may exhibit duty cycle variation of less than 5 ps for a clock cycle of 3 ns.

In the depicted embodiment, the input signals EVEN and ODD may be provided to the phase mixer circuit 106. The phase mixer circuit 106 may have an even input terminal and an odd input terminal configured to receive the input signals EVEN and ODD, respectively. The phase mixer circuit 106 may also be configured to receive the control signal Q<0:N>. The control signal Q<0:N> may be a multibit signal configured to provide control information to the phase mixer circuit 106. The control information may be used by the phase mixer circuit 106 to weight the input signals EVEN and ODD relative to each other. The phase mixer circuit 106 may provide an intermediate signal OUTA having a phase between the phases of the input signals EVEN and ODD. Example circuits for implementing the phase mixer circuit 106 are discussed in further detail below with respect to FIGS. 3 and 4.

Similarly, the input signals EVENF and ODDF may be provided to the phase mixer circuit 108. The phase mixer circuit 108 may have an even input terminal configured to receive the input signal EVENF and an odd input terminal configured to receive the input signal ODDF. The phase mixer circuit 108 may also be configured to receive the control signal Q<0:N> that provides control information to the phase mixer circuit 108. The control information may be used by the phase mixer circuit 108 to weight the input signals EVENF and ODDF relative to each other. The phase mixer circuit 108 may provide an intermediate signal OUTB having a phase between the phases of the input signals EVENF and ODDF. Example embodiments of the phase mixer circuit 108 are discussed in further detail below with respect to FIGS. 3 and 4.

As shown in the embodiment of FIG. 1A, the intermediate signal OUTB of the phase mixer circuit 108 may be provided to the output inverter 110. The output inverter 110 may compensate for the complementary nature of the input signals (i.e., EVEN being complementary to EVENF and ODD being complementary to ODDF). The intermediate signals OUTA and OUTB may be differential signals having complementary duty cycle distortion information. The intermediate signals OUTA and OUTB may be balanced and symmetrical (i.e., both OUTA and OUTB have substantially the same drive and loading). The output inverter 110 accounts for the differential nature of the differential phase mixer 104 by inverting one of the intermediate signals (i.e., OUTA, OUTB) provided by the differential phase mixer 108 prior to combining the intermediate signals OUTA and OUTB to create the output signal OUT of the phase interpolation circuit 102. In the embodiment illustrated by FIG. 1A, the intermediate signal OUTB is inverted by the inverter 110. However, in some embodiments, the intermediate signal OUTA is inverted by the inverted 110. After inverting one of the intermediate signals (e.g., OUTB), the two intermediate signals OUTA and OUTB may be combined at a node to provide the output signal OUT of the phase interpolation circuit 102. In various embodiments, the output signal OUT has a phase that is between the phases of the input signals EVEN and ODD based on the control signal Q<0:N>.

By employing a differential phase mixer as shown in FIG. 1A and combining the intermediate signals OUTA and OUTB, the phase interpolation circuit 102 may provide an output signal OUT that demonstrates reduced duty cycle variation and increased linearity in step size. The differential phase mixer may ensure that both the rising edge and the falling edge of each clock signal pass through identical phase mixing paths simultaneously. This may ensure that any duty cycle distortion caused by the phase mixing is applied in a complementary manner to the rising and falling edges. The result is that the duty cycle distortion applied to each of the rising and falling edges largely offsets or cancels, resulting in an output signal that demonstrates reduced duty cycle variation.

Figure 1B:
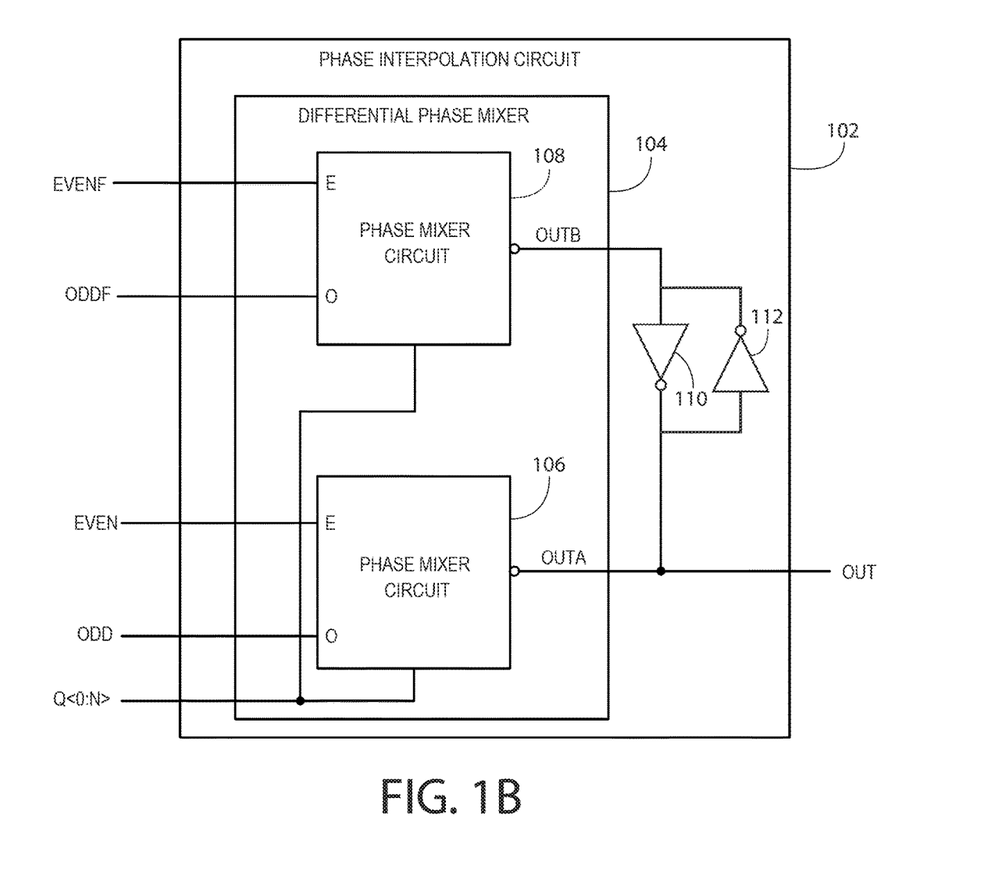
FIG. 1B is a functional block diagram of a phase interpolation circuit, in accordance with an embodiment of the present invention.

FIG. 1B is a functional block diagram of the phase interpolation circuit 102, in accordance with an embodiment of the present invention. FIG. 1B includes the differential phase mixer 104, the phase mixer circuits 106 and 108, and the output inverter 110. Each of the differential phase mixer 104, the phase mixer circuits 106 and 108, and the output inverter 110 may be implemented as described above with respect to FIG. 1A. The phase interpolation circuit 102 as shown in FIG. 1B includes a second output inverter 112, which may be configured as shown in conjunction with the output inverter 110 to form a cross-couple latch. As discussed above, the intermediate signals OUTA and OUTB may be balanced and symmetrical. To preserve the balanced nature of the intermediate signals, the second output inverter 112 may be coupled to the output inverter 110 to form a cross-couple latch.

Figure 2:
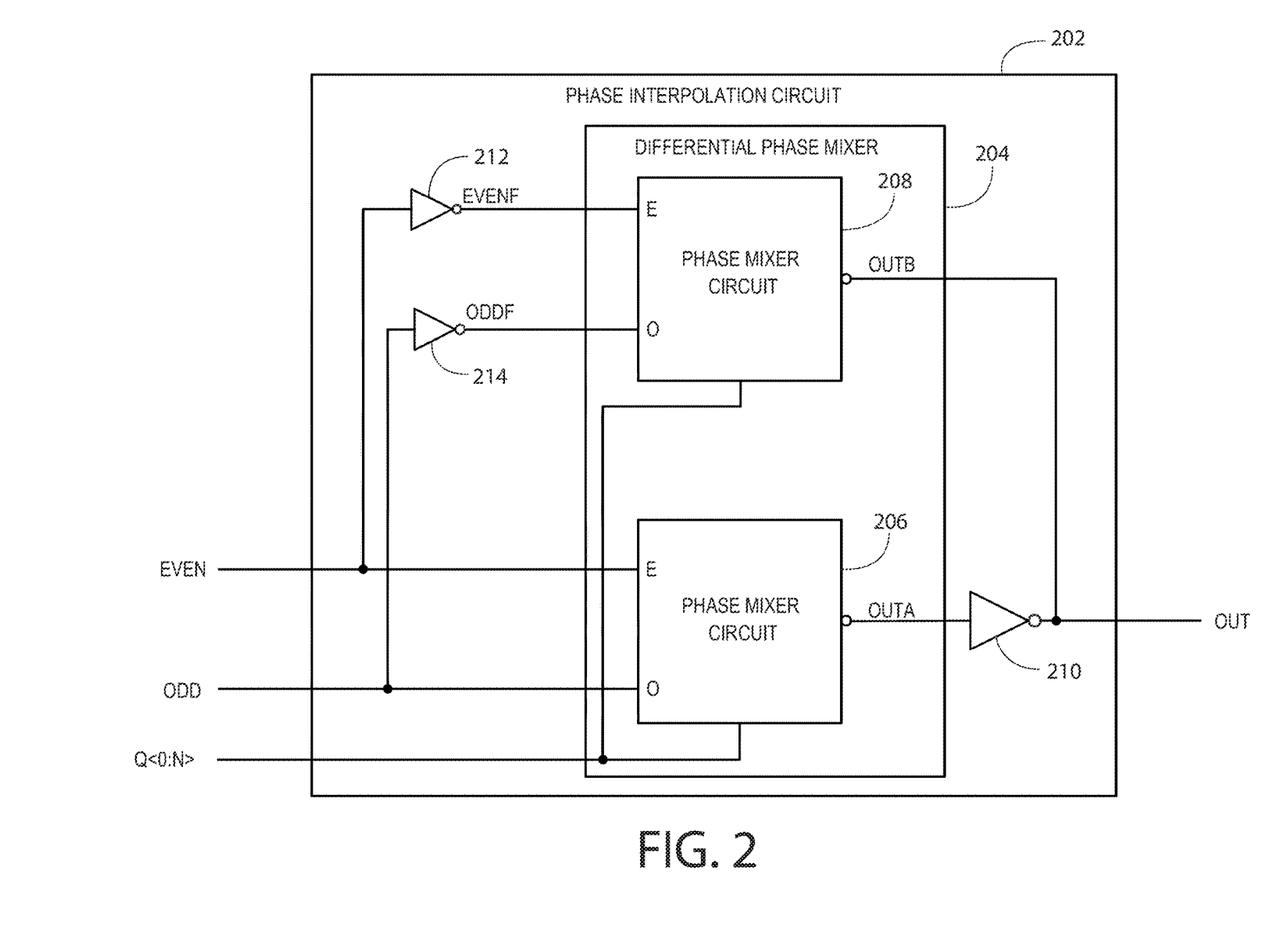
FIG. 2 is a functional block diagram of a phase interpolation circuit, in accordance with an embodiment of the present invention.

FIG. 2 is a functional block diagram of a phase interpolation circuit 202, in accordance with an embodiment of the present invention. The phase interpolation circuit includes a differential phase mixer 204, and inverters 210, 212, and 214. The differential phase mixer 204 includes phase mixer circuits 206 and 208. The phase mixer circuits 206 and 208 may be implemented as phase mixer circuits 106 and 108 as described above with respect to FIG. 1A-B. Example circuits for implementing phase mixer circuits 206 and 208 are described in further detail below with respect to FIGS. 3 and 4.

In the embodiment of FIG. 2, the phase interpolation circuit 202 receives input signals EVEN and ODD, as well as a control signal Q<0:N>. The control signals Q<0:N> may be implemented as described above with respect to FIG. 1A-B. The input signals EVEN and ODD may be provided to input terminals of the differential phase mixer 204 and the phase mixer circuit 206. Additionally, the input signals EVEN and ODD may be coupled to input terminals of the inverters 212 and 214, respectively. The inverters 212 and 214 may provide signals EVENF and ODDF, respectively. In various embodiments, the signals EVENF and ODDF may be complementary to the input signals EVEN and ODD. As described above with respect to FIG. 1A, the signals EVENF and ODDF may be provided to even and odd input terminals of the phase mixer circuit 208. As described above with respect to FIG. 1A, the phase mixer circuits 206 and 208 may be configured to provide intermediate signals OUTA and OUTB having phases between their respective input signals as determined by the control signals Q<0:N>. The intermediate signals OUTA and OUTB may be differential signals having complementary duty cycle distortion information. As in FIGS. 1A-B, the intermediate signals OUTA and OUTB may be balanced, but may be implemented with a common-centroid architecture.

The intermediate signal OUTA may be provided to the inverter 210. As described above with respect to FIG. 1A, one of the intermediate signals OUTA or OUTB may be inverted prior to coupling the intermediate signals OUTA and OUTB to account for the differential nature of the differential phase mixer 204. In the depicted embodiment, the output of the inverter 210 is coupled to the intermediate signal OUTB at a node to provide the output signal OUT. In various embodiments, the inverter 210 may approximate an intrinsic delay associated with the inverters 212 and 214. By matching the intrinsic delay of the inverter 210 with the intrinsic delays of the inverters 212 and 214, the total delay along each path of the phase interpolation circuit 202 may be approximately equivalent. In contrast with the embodiment of FIG. 1B, the embodiment of FIG. 2 is not symmetrical. Rather, the embodiment is arranged in a common-centroid layout. Because of the common-centroid layout, the single output inverter 210 (as opposed to the cross-couple latch of FIG. 1B) may be used and selected to approximate the intrinsic delays of the inverters 212 and 214. After inverting one of the intermediate signals (e.g., intermediate signal OUTA), the intermediate signals OUTA and OUTB may be combined to provide an output signal OUT having a phase that is between the phases of the input signals EVEN and ODD. In various embodiments, the output signal OUT may demonstrate reduced duty cycle variation and increased linearity of step size over traditional phase mixer circuits.

Figure 3:
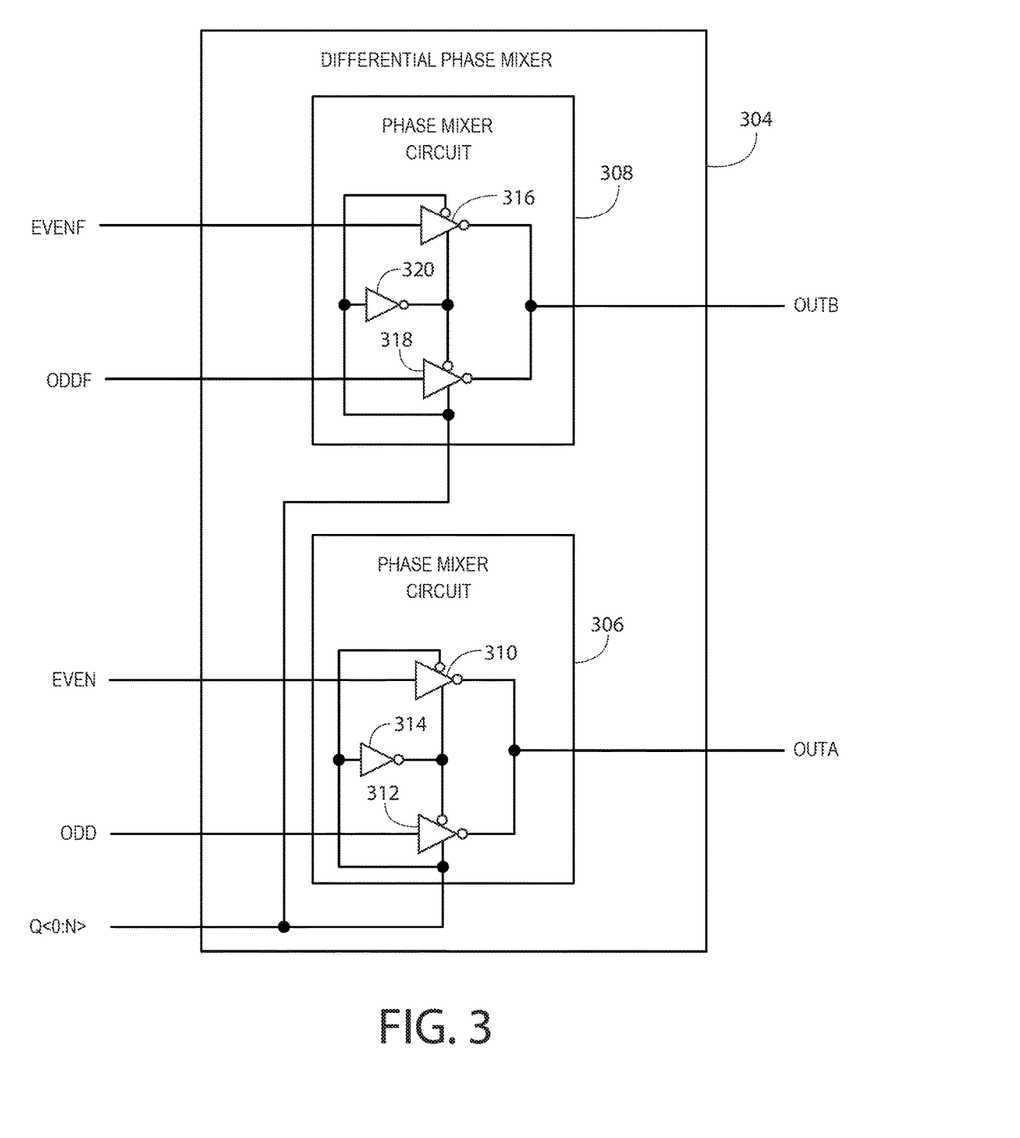
FIG. 3 is an example differential phase mixer circuit, in accordance with an embodiment of the present invention.

FIG. 3 is an example differential phase mixer 304, in accordance with an embodiment of the present invention. The differential phase mixer 304 may be implemented as the differential phase mixers 104 and 204, as described above with respect to FIGS. 1 and 2, respectively. The differential phase mixer 304 is configured to receive input signals EVEN, ODD, EVENF, and ODDF. The input signals may be implemented as described above in FIGS. 1 and/or 2. The differential phase mixer 304 may also be configured to receive a control signal Q<0:N>. As described above, the control signals Q<0:N> may provide control information to the differential phase mixer 304 to weight the input signals relative to one another. In various embodiments, the control signals Q<0:N> may be a multibit signal. The differential phase mixer 304 includes phase mixer circuits 306 and 308. The phase mixer circuits 306 and 308 may be implemented as the phase mixer circuits 106, 108, 206 and/or 208, as described above.

The phase mixer circuit 306 may include inverters 310, 312, and 314. The inverter 310 may be configured to receive the input signal EVEN and the inverter 312 may be configured to receive the input signal ODD. In various embodiments, the inverters 310 and 312 may each represent a number of parallel inverters. The parallel inverters may have different drive strengths relative to one another to enable weighting of the input signals EVEN and ODD relative to one another. The inverters 310 and 312 may be further configured to receive a control signal Q<0:N>. The control signal may selectively activate or deactivate one or more of the parallel inverters represented by the inverters 310 and/or 312 by, for example, causing the one or more of the parallel inverters to enter a high impedance state. The control signal Q<0:N> may be coupled to an inverting control input of the inverter 310, a non-inverting control input of the inverter 312, and to an input terminal of the inverter 314. The output terminal of the inverter 314 may be coupled to a non-inverting control input of the inverter 310 and an inverting control input of the inverter 312. Each bit of the control signal Q<0:N> may correspond to one of the parallel inverters represented by the inverters 310 and 312. Based on the value of each bit in the control signal Q<0:N>, the input signals EVEN and ODD may be weighted by selectively activating or deactivating one or more of the parallel inverters represented by the inverters 310 and/or 312. The output of the inverters 310 and 312 may be coupled together to provide the intermediate signal OUTA.

Similarly, the phase mixer circuit 308 may include inverters 316, 318, and 320. The inverter 316 may be configured to receive the input signal EVENF, and the inverter 318 may be configured to receive the input signal ODDF. The inverters 316 and 318 may represent a number of parallel inverters, each of which may have a different drive strength to enable selective weighting of the input signals. As with the inverters 310 and 312, the inverters 316 and 318 may be selectively activated or deactivated based on the control signal Q<0:N>. The control signal Q<0:N> may be coupled to an inverting control input of the inverter 316, a non-inverting control input of the inverter 318, and to the inverter 320. The output of the inverter 320 may be coupled to a non-inverting control input of the inverter 316 and to an inverting control input of the inverter 318. Each bit of the control signal Q<0:N> may correspond to one of the parallel inverters represented by the inverters 316 and 318. Based on the value of each bit in the control signal Q<0:N>, the input signals EVENF and ODDF may be weighted by selectively activating or deactivating one or more of the parallel inverters represented by the inverters 316 and/or 318. The output of the inverters 316 and 318 may be coupled together at a node to provide the intermediate signal OUTB.

Figure 4:
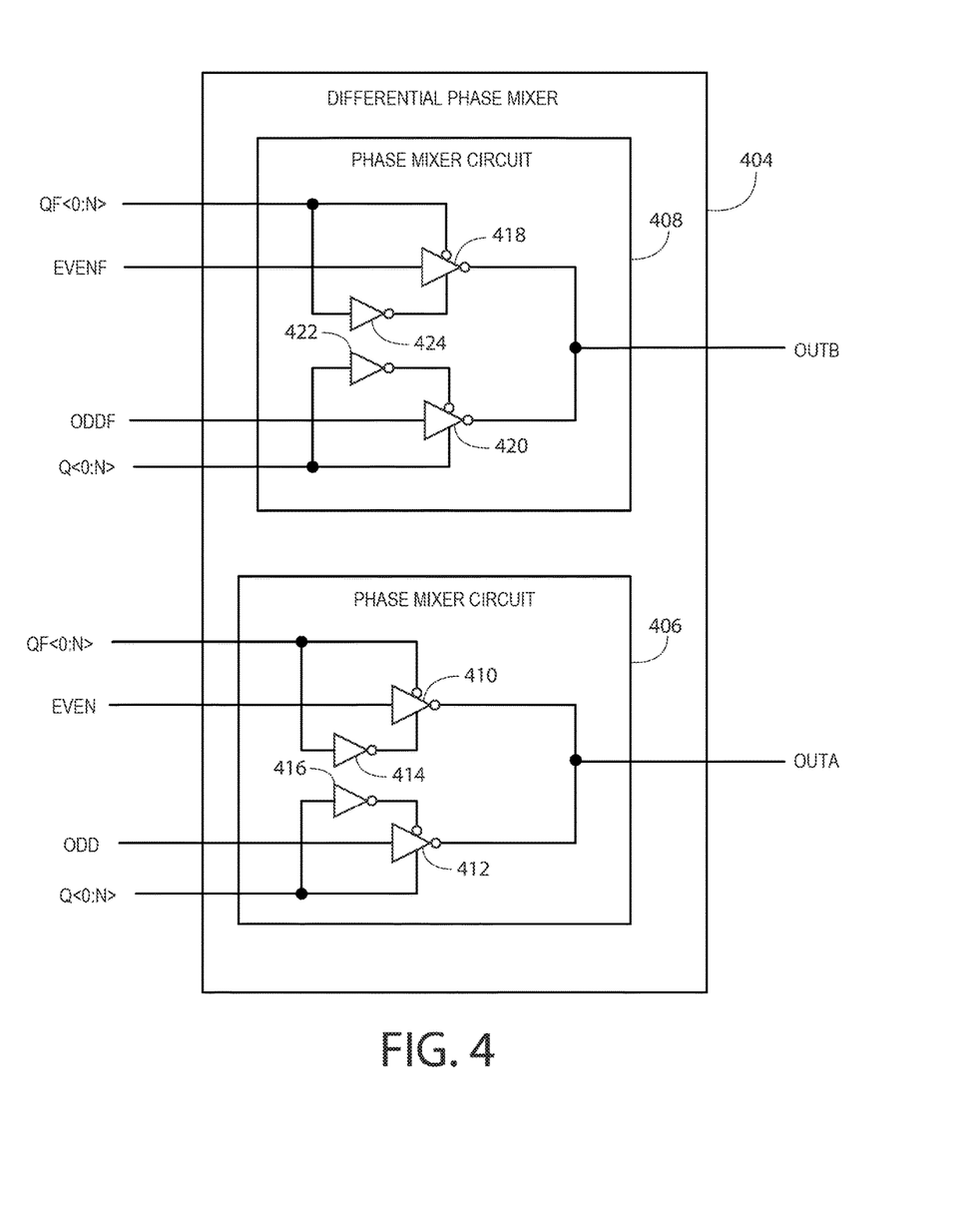
FIG. 4 is an example differential phase mixer circuit, in accordance with an embodiment of the present invention.

FIG. 4 is an example differential phase mixer 404, in accordance with an embodiment of the present invention. The differential phase mixer 404 may be implemented as the differential phase mixers 104, 204. The differential phase mixer 404 may be configured to receive input signals EVEN, ODD, EVENF, and ODDF. The input signals may be implemented as described above in FIGS. 1 and/or 2. The differential phase mixer 404 may be further configured to receive a control signal Q<0:N> and a complementary control signal QF<0:N>. The differential phase mixer 404 may be further configured to provide intermediate signals OUTA, OUTB. The intermediate signals OUTA, OUTB may be implemented as described above with respect to FIGS. 1 and 2. The differential phase mixer 404 may include phase mixer circuits 406, 408.

The phase mixer circuit 406 may include inverters 410, 412, 414, and 416. In the depicted embodiment, the inverter 410 is configured to receive the input signal EVEN, and the inverter 412 is configured to receive the input signal ODD. The inverters 410 and 412 may each represent a number of parallel inverters. Each of the parallel inverters may have different drive strengths to allow for selective weighting of the input signals. To facilitate selective weighting of the input signals, the inverters 410 and 412 may be further configured to be selectively activated or deactivated by the control signal Q<0:N> and the complementary control signal QF<0:N>, respectively. The control signal Q<0:N> may be provided to a non-inverting control input of the inverter 412 and to an inverter 416. The output of the inverter 416 may be coupled to an inverting control input of the inverter 412. As described above with respect to FIG. 3, the control signal Q<0:N> may be a multibit signal having one bit corresponding to each of the parallel inverters represented by the inverter 412. Similarly, the complementary control signal QF<0:N> may be provided to an inverting control terminal of the inverter 410 and to the inverter 414. The output of the inverter 414 may be coupled to a non-inverting control input of the inverter 410. The complementary control signal QF<0:N> may be a multibit signal having one bit corresponding to each of the parallel inverters represented by the inverter 410. The outputs of the inverters 412 and 410 may be coupled together to provide the intermediate signal OUTA, as described above. The intermediate signal OUTA may have a phase between the phases of the input signals EVEN and ODD. Those skilled in the art will appreciate that, the embodiment of FIG. 4, in which each of the phase mixer circuits 406 and 406 includes four inverters may enable independent control of the application of the control signals Q<0:N> and QF<0:N> to the inverters and may provide of simple implementation of additional circuits such as negative-bias temperature instability control.

The phase mixer circuit 408 may be implemented similar to the phase mixer 406 described above, but with the complementary input signals EVENF and ODDF. The phase mixer circuit 408 may include inverters 418, 420, 422, and 424. The input signal EVENF may be provided to the input terminal of the inverter 418, and the input signal ODDF may be provided to the input terminal of the inverter 420. As with the inverters 410 and 412, the inverters 418 and 420 may represent a number of parallel inverters. In some embodiments, each of the parallel inverters may have different drive strengths which may facilitate selective weighting of the input signals EVENF and ODDF based on the control signal Q<0:N> and/or the complementary control signal QF<0:N>. The control signal Q<0:N> may be provided to a non-inverting control input of the inverter 420 and to the inverter 422. The output of the inverter 422 may be coupled to an inverting control input of the inverter 420. The complementary control signal QF<0:N> may be coupled to an inverting control input of the inverter 418 and to the inverter 424. The output of the inverter 424 may be coupled to a non-inverting control input of the inverter 418. The outputs of the inverters 418 and 420 may be coupled to provide the intermediate signal OUTB. The intermediate signal OUTB may have a phase between the phases of the input signals EVENF and ODDF. The intermediate signals OUTA and OUTB may be coupled at a node as described above with respect to FIGS. 1 and 2 to provide an output signal OUT.

Figure 5:
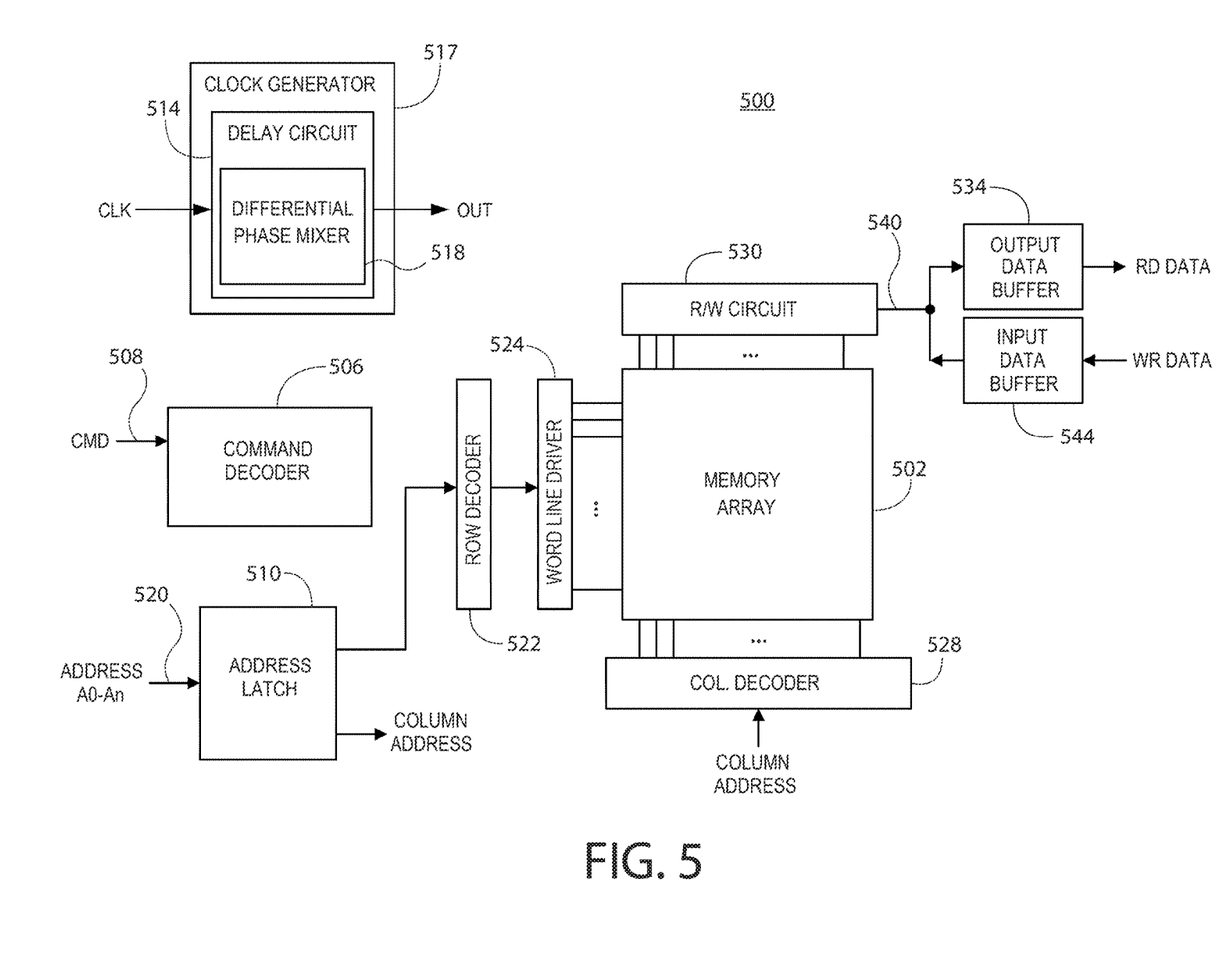
FIG. 5 is a block diagram of a memory depicting an apparatus including a differential phase mixer, in accordance with an embodiment of the present invention.

FIG. 5 is a block diagram of a memory 500 including a including a differential phase mixer, according to an embodiment of the invention. The memory 500 may include an array 502 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 500 includes a command decoder 506 that may receive memory commands through a command bus 508 and provide (e.g., generate) corresponding control signals within the memory 500 to carry out various memory operations. For example, the command decoder 506 may respond to memory commands provided to the command bus 508 to perform various operations on the memory array 502. In particular, the command decoder 506 may be used to provide internal control signals to read data from and write data to the memory array 502. Row and column address signals may be provided (e.g., applied) to an address latch 510 in the memory 500 through an address bus 520. The address latch 510 may then provide (e.g., output) a separate column address and a separate row address.

The address latch 510 may provide row and column addresses to a row address decoder 522 and a column address decoder 528, respectively. The column address decoder 528 may select bit lines extending through the array 502 corresponding to respective column addresses. The row address decoder 522 may be connected to a word line driver 524 that activates respective rows of memory cells in the array 502 corresponding to received row addresses. The selected data line (e.g., a bit line or bit lines) corresponding to a received column address may be coupled to a read/write circuitry 530 to provide read data to an output data buffer 534 via an input-output data path 540. Write data may be provided to the memory array 502 through an input data buffer 544 and the memory array read/write circuitry 530.

The memory 500 may include a clock generator 517 that includes a delay circuit 514. The delay circuit 514 provides an output clock signal OUT 512 that may be used for clocking circuitry of the memory 500. For example, the output clock signal OUT 512 may be used for clocking the output data buffer 534 and/or the input data buffer 544. Other circuits of the memory 500 may be clocked as well. The delay circuit 514 may include a differential phase mixer 518, according to an embodiment of the invention. For example, the delay circuit 514 may include a differential phase mixer as described with reference to any of FIGS. 1-4.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
  a phase interpolation circuit including first and second phase mixer circuits including corresponding first inverters, corresponding second inverters, corresponding third inverters, and corresponding fourth inverters,
  the corresponding first inverters of the first and second phase mixer circuits configured to receive, respectively, a first input signal and a complimentary first input signal, each of the corresponding first inverters of the first and second phase mixer circuits configured to be controlled by a first control signal received, via the corresponding second inverter, at a non-inverting control input of the corresponding first inverter, each of the corresponding first inverters of the first and second phase mixer circuits further configured to be controlled by the first control signal received at an inverting control input of the corresponding first inverter,
  the corresponding third inverters of the first and second phase mixer circuits configured to receive, respectively, a second input signal and a complimentary second input signal, each of the corresponding third inverters of the first and second phase mixer circuits configured to be controlled by a second control signal received, via the corresponding fourth inverter, at an inverting control input of the corresponding third inverter, each of the corresponding third inverters of the first and second phase mixer circuits further configured to be controlled by the second control signal received at a non-inverting control input of the corresponding third inverter, the phase interpolation circuit configured to provide an output signal based on corresponding outputs of the first and second phase mixer circuits.

2. The apparatus of claim 1, wherein the corresponding first inverters of the first and second phase mixer circuits are configured to provide corresponding first internal output signals to corresponding output nodes of the first and second phase mixer circuits.

3. The apparatus of claim 2, wherein the corresponding third inverters of the first and second phase mixer circuits are configured to provide corresponding second internal output signals to the corresponding output nodes of the first and second phase mixer circuits.

4. The apparatus of claim 3, wherein the corresponding output nodes of the first and second phase mixer circuits are configured to output, respectively, first and second intermediate signals from the corresponding outputs of the first and second phase mixer circuits.

5. The apparatus of claim 4, wherein the first intermediate signal experiences a first duty cycle variation and the second intermediate signal experiences a second duty cycle variation that is complementary to the first duty cycle variation.

6. The apparatus of claim 4, further comprising:
a first output inverter coupled between the corresponding output node of the second phase mixer circuit and a shared output node; and
a second output inverter coupled between the corresponding output node of the second phase mixer circuit and the shared output node.

7. The apparatus of claim 6, wherein the corresponding output node of the second phase mixer circuit is coupled to an input of the first output inverter, and the shared output node is coupled to an output of the first output inverter, and
wherein the corresponding output node of the second phase mixer circuit is coupled to an output of the second output inverter, and the shared output node is coupled to an input of the second output inverter.

8. The apparatus of claim 6, wherein the first and second output inverters are coupled in a latch configuration.

9. An apparatus comprising:
a phase interpolation circuit including first and second phase mixer circuits and configured to provide an output signal based on corresponding outputs of the first and second phase mixer circuits, the first and second phase mixer circuits including corresponding first inverters, corresponding second inverters, corresponding third inverters, and corresponding fourth inverters,
the corresponding first inverters of the first and second phase mixer circuits configured to receive, respectively, a first input signal and a complimentary first input signal, each of the corresponding first inverters of the first and second phase mixer circuits configured to be controlled by a first control signal received, via the corresponding second inverter, at a non-inverting control input of the corresponding first inverter, the corresponding first inverters of the first and second phase mixer circuits configured to provide corresponding first internal output signals to corresponding output nodes of the first and second phase mixer circuits, the corresponding third inverters of the first and second phase mixer circuits configured to receive, respectively, a second input signal and a complimentary second input signal, each of the corresponding third inverters of the first and second phase mixer circuits configured to be controlled by a second control signal received, via the corresponding fourth inverter, at an inverting control input of the corresponding third inverter, the corresponding third inverters of the first and second phase mixer circuits configured to provide corresponding second internal output signals to the corresponding output nodes of the first and second phase mixer circuits, the corresponding output nodes of the first and second phase mixer circuits configured to output, respectively, first and second intermediate signals from the corresponding outputs of the first and second phase mixer circuits.

10. The apparatus of claim 9, wherein the first intermediate signal experiences a first duty cycle variation and the second intermediate signal experiences a second duty cycle variation that is complementary to the first duty cycle variation.

11. The apparatus of claim 9, further comprising:
a first output inverter coupled between the corresponding output node of the second phase mixer circuit and a shared output node; and
a second output inverter coupled between the corresponding output node of the second phase mixer circuit and the shared output node.

12. The apparatus of claim 11, wherein the corresponding output node of the second phase mixer circuit is coupled to an input of the first output inverter, and the shared output node is coupled to an output of the first output inverter, and
wherein the corresponding output node of the second phase mixer circuit is coupled to an output of the second output inverter, and the shared output node is coupled to an input of the second output inverter.

13. The apparatus of claim 12, wherein the first and second output inverters are coupled in a latch configuration.

14. An apparatus comprising:
a phase interpolation circuit including first and second phase mixer circuits configured to provide an output signal based on corresponding outputs of the first and second phase mixer circuits, the first and second phase mixer circuits including corresponding first inverters, corresponding second inverters, corresponding third inverters, and corresponding fourth inverters,
the corresponding first inverters of the first and second phase mixer circuits configured to receive, respectively, a first input signal and a complimentary first input signal, each of the corresponding first inverters of the first and second phase mixer circuits configured to be controlled by a first control signal received, via the corresponding second inverter, at a non-inverting control input of the corresponding first inverter,
the corresponding third inverters of the first and second phase mixer circuits configured to receive, respectively, a second input signal and a complimentary second input signal, each of the corresponding third inverters of the first and second phase mixer circuits configured to be controlled by a second control signal received, via the corresponding fourth inverter, at an inverting control input of the corresponding third inverter, the first and second phase mixer circuits including corresponding output nodes configured to output, respectively, first and second intermediate signals from the corresponding outputs of the first and second phase mixer circuits, the first intermediate signal output from the corresponding output node of the first phase mixer circuit based on the corresponding first and second input signals received by the first phase mixer circuit, the second intermediate signal output from the corresponding output node of the second phase mixer circuit based on the corresponding first and second input signals received by the second phase mixer circuit.

15. The apparatus of claim 14, wherein the first intermediate signal output from the first phase mixer circuit is provided to a shared output node, and wherein the second intermediate signal output from the second phase mixer circuit is provided to the shared output node.

16. The apparatus of claim 15, further comprising:
a first output inverter coupled between the corresponding output node of the second phase mixer circuit and the shared output node,
wherein the second intermediate signal output from the second phase mixer circuit is provided, via the first output inverter, to the shared output node.

17. The apparatus of claim 16, further comprising:
a second output inverter coupled between the corresponding output node of the second phase mixer circuit and the shared output node.

18. The apparatus of claim 17, wherein the first and second output inverters are coupled in a latch configuration.

19. The apparatus of claim 18, wherein the corresponding output node of the second phase mixer circuit is coupled to an input of the first output inverter, and the shared output node is coupled to an output of the first output inverter.

20. The apparatus of claim 19, wherein the corresponding output node of the second phase mixer circuit is coupled to an output of the second output inverter, and the shared output node is coupled to an input of the second output inverter.

* * * * *